(12) United States Patent
Yajima

(10) Patent No.: US 7,475,802 B2
(45) Date of Patent: Jan. 13, 2009

(54) METHOD FOR LOW LOOP WIRE BONDING

(75) Inventor: Kaoru Yajima, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 227 days.

(21) Appl. No.: 10/835,013

(22) Filed: Apr. 28, 2004

(65) Prior Publication Data

US 2005/0242159 A1 Nov. 3, 2005

(51) Int. Cl.
    *B23K 31/00* (2006.01)
(52) U.S. Cl. ...................... 228/180.5; 228/4.5
(58) Field of Classification Search .......... 228/180.5, 228/4.5, 110.1
    See application file for complete search history.

(56) References Cited

U.S. PATENT DOCUMENTS

| 3,384,283 | A |   | 5/1968  | Mims ........................ 228/1        |
| 3,397,451 | A |   | 8/1968  | Avedissian et al. ............ 29/589      |
| 3,444,612 | A |   | 5/1969  | Pennings ................... 29/471.1      |
| 5,156,323 | A | * | 10/1992 | Kumazawa et al. ...... 228/180.5           |
| 5,254,501 | A | * | 10/1993 | Tung et al. ................... 29/827     |
| 5,328,079 | A | * | 7/1994  | Mathew et al. ........... 228/180.5        |
| 6,329,278 | B1| * | 12/2001 | Low et al. .................. 438/617      |
| 6,561,411 | B2| * | 5/2003  | Lee ........................... 228/180.5  |
| 6,715,666 | B2| * | 4/2004  | Imai et al. ................. 228/180.5    |
| 6,854,637 | B2| * | 2/2005  | Harun et al. ............. 228/180.5       |
| 6,921,016 | B2| * | 7/2005  | Takahashi ................ 228/180.5       |
| 2004/0152292 | A1| * | 8/2004 | Babinetz et al. ............. 438/617     |
| 2005/0072833 | A1| * | 4/2005 | Wong et al. .............. 228/180.5      |

OTHER PUBLICATIONS

"Wire Bonding Module," www.eccb.org website, pp. 1-12, Aug. 15, 2003.

\* cited by examiner

*Primary Examiner*—Kevin P Kerns
*Assistant Examiner*—Michael Aboagye
(74) *Attorney, Agent, or Firm*—Yingsheng Tung; Wade J. Brady, III; Frederick J. Telecky, Jr.

(57) ABSTRACT

A method is provided for low loop wire bonding. The method includes forming a first bond between a first bonding ball disposed at an end of a first wire and a bond pad of a die coupled to a leadframe having one or more leads. The method also includes forming a second bond between a portion of the wire and a lead of the leadframe. The length of wire between the first and second bonds forms a loop in the wire having a first loop height. The method further includes disposing a second bonding ball on top of the first bonding ball, a portion of the loop being compressed between the first and second bonding balls. The compressed loop has a second loop height less than the first loop height. The method also includes forming a third bond between the second bonding ball, the wire, and the first bonding ball.

11 Claims, 5 Drawing Sheets

US 7,475,802 B2

METHOD FOR LOW LOOP WIRE BONDING

TECHNICAL FIELD OF THE INVENTION

This invention relates generally to the field of semiconductors and, more particularly, to a system and method for low loop wire bonding.

BACKGROUND OF THE INVENTION

The typical wire bonding process in integrated circuit manufacturing uses a conventional conductive wire having a bonding ball at its end that is bonded to a pad of a die. After the ball is bonded to the pad, the other end of the wire is bonded to a lead of a leadframe, creating a "loop" in the wire. The height of the wire loop directly influences the height of the semiconductor package. As semiconductor packaging becomes more compact, such as with thin packages or stacked packages, minimizing packaging size and ensuring reliability become increasingly important considerations in semiconductor design. Therefore, minimizing loop height is important to reducing the size of semiconductor packaging.

SUMMARY OF THE INVENTION

In one embodiment of the present invention, a method is provided for low loop wire bonding. The method includes forming a first bond between a first bonding ball disposed at an end of a first wire and a bond pad of a die coupled to a leadframe having one or more leads. The method also includes forming a second bond between a portion of the wire and a lead of the leadframe. The length of wire between the first and second bonds forms a loop in the wire having a first loop height. The method further includes disposing a second bonding ball on top of the first bonding ball, a portion of the loop being compressed between the first and second bonding balls. The compressed loop has a second loop height less than the first loop height. The method also includes forming a third bond between the second bonding ball, the wire, and the first bonding ball.

In another embodiment of the present invention, a system for low loop wire bonding includes a die coupled to a leadframe, the die having one or more bond pads. The leadframe has one or more leads. The system further includes a first wire having a bonding ball disposed at one end, the bonding ball bonded at a first bond to a bond pad of the die, a portion of the wire bonded at a second bond to a lead of the leadframe. The length of wire between the first and second bonds forms a loop in the wire having a first loop height. The system also includes a third bond formed between a second bonding ball, the wire, and the first bonding ball, the second bonding ball disposed on top of the first bonding ball. A portion of the loop is compressed between the first and second bonding balls. The compressed loop has a second loop height less than the first loop height.

In another embodiment of the present invention, a method is provided for low loop wire bonding. The method includes disposing a gold wire within a bonding head. The gold wire includes a first bonding ball disposed at one end of the wire. The first bonding ball extends from an end of the bonding head. The method also includes positioning the bonding head relative to the leadframe to position the first bonding ball relative to a bond bad to which a first bond will be formed and forming the first bond between the first bonding ball and the bond pad. The method also includes positioning the bonding head relative to the leadframe to position a portion of the wire relative to a lead of the leadframe to which a second bond will be formed. The method further includes forming the second bond between the portion of the wire and the lead. The length of wire between the first and second bonds forms a loop in the wire having a first loop height. The method also includes severing the wire proximate to the second bond and forming a second bonding ball at the tip of the severed wire. The method also includes disposing the second bonding ball on top of the first bonding ball. A portion of the loop is compressed between the first and second bonding balls. The compressed loop has a second loop height less than the first loop height and the second loop height is approximately less than 52 μm. The method also includes forming a third bond between the second bonding ball, the wire, and the first bonding ball. The first, second, and third bonds are formed using a bonding method selected from the group consisting of thermocompression bonding and thermosonic bonding.

Technical advantages of one or more embodiments of the present invention may include a reduced wire bond loop height that allows for a reduction in the overall size of the semiconductor package. Another technical advantage of one or more embodiments of the present invention is the ability to increase the reliability of the semiconductor assembly by increasing the pull strength of the loop wires.

Certain embodiments may provide all, some, or none of these technical advantages. Certain embodiments may provide one or more other technical advantages, one or more of which may be readily apparent to those skilled in the art from the figures, description, and claims included herein.

BRIEF DESCRIPTION OF THE DRAWINGS

For a more complete understanding of the present invention, and for further features and advantages, reference is now made to the following description, taken in conjunction with the accompanying drawings, in which.

DETAILED DESCRIPTION OF THE INVENTION

Embodiments of the present invention and its advantages are best understood by referring to FIGS. 1 through 4 of the drawings, like numerals being used for like and corresponding parts of the various drawings.

The semiconductor manufacturing process is divided into two main processes: (1) wafer fabrication and (2) wafer testing, assembly, and packaging. The process of wafer fabrication is a series of steps that build successive layers of materials in and on a blank silicon wafer to form a semiconductor device, such as an integrated circuit. Examples of these steps include oxidation, photolithography, deposition, metallization and chemical mechanical planarization, among others. These wafer fabrication steps are well known in the art and are not described in further detail.

Figure 1A:
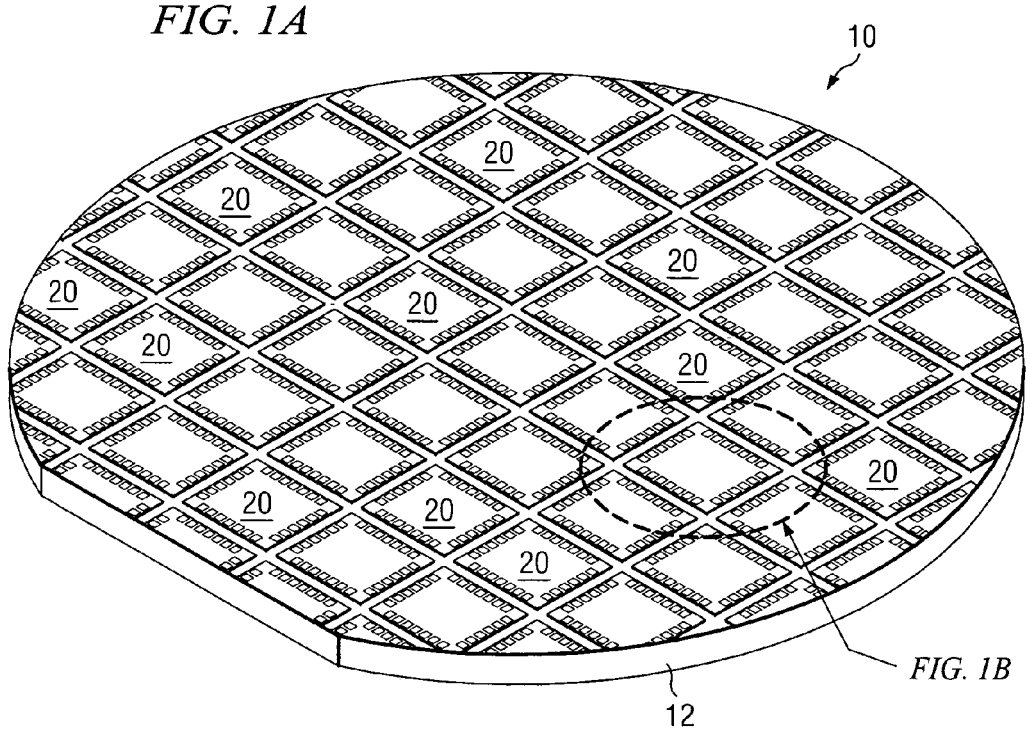
FIG. 1A illustrates a fabricated semiconductor wafer.
Figure 1B:
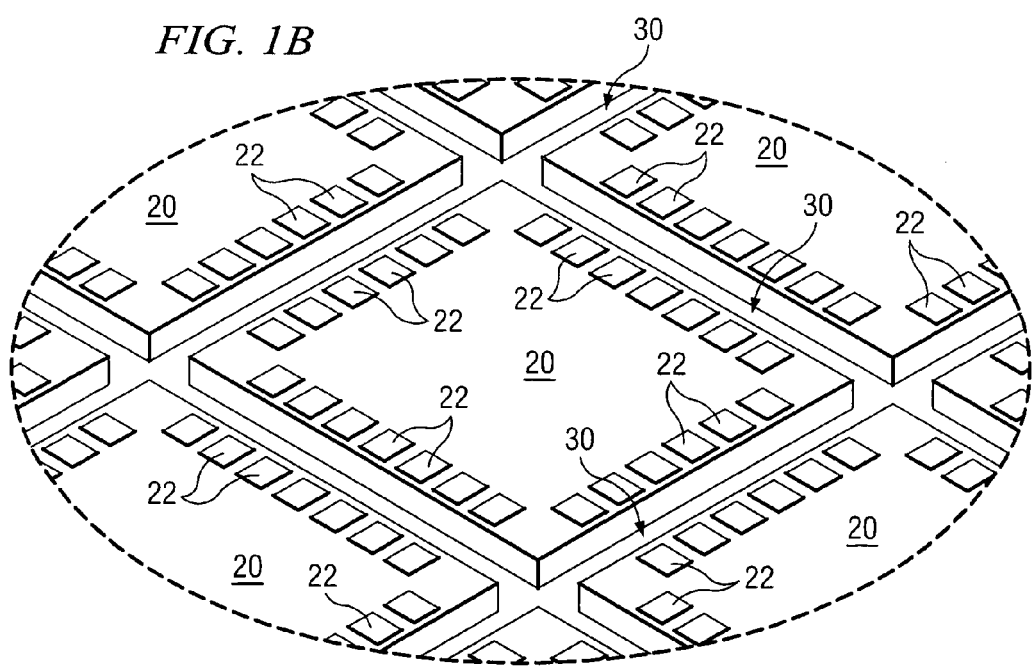
FIG. 1B illustrates an enlarged portion of the wafer of FIG. 1A.

FIGS. 1A and 1B illustrate the product that typically results from wafer fabrication. This product is a fabricated wafer 10 comprising a grid of die 20 formed in and on a blank semiconductor wafer 12. Each die 20 comprises an individual semiconductor device (e.g., an integrated circuit) that was formed during the fabrication stage. Fabricated wafer 10 may contain any number of die 20, depending on their complexity and size. Each die 20 includes a number of bond pads or bonding pads 22 that line the edges of die 20. Bond pads 22 are conductive areas coupled to various parts of the integrated circuit such that electrical signals may be supplied to the circuit. Bond pads 22 may be made from any suitable conductive material, such as metal, may have any suitable size and shape, and may be formed on die 20 in any suitable pattern. Die 20 are separated on fabricated wafer 10 by scribe channels 30 (alternatively called scribe lines or saw lines). Scribe channels 30 comprise the area between the periphery of each die 20 (the portions of blank wafer 12 on which circuits or other structures have not been fabricated).

After wafer 10 has been fabricated, wafer 10 is functionally tested during which time each die 20 may be marked as accepted or rejected depending upon the results of the testing. Wafer testing is well known in the art and is not described in further detail. Wafers 10 arriving from the testing stage typically either have the reject die marked with ink dots or are accompanied by a map of the locations of any defects in the die which may have caused the die to be rejected. The first step in the assembly stage is to separate the die 20 by using a precision saw to cut down scribe channels 30 (alternatively, the die may be separated by scribing). The die 20 that were marked as rejects are discarded, and the die 20 that passed the testing stage are each attached to a frame for packaging (typically referred to as a leadframe), as described in more detail with respect to FIG. 2. In the packaging stage, one or more bond pads 22 of a die 20 are coupled to a corresponding lead on the package leadframe via a thin metallic wire, such as a gold wire, as described in further detail with respect to FIGS. 3A-3I.

Figure 2:
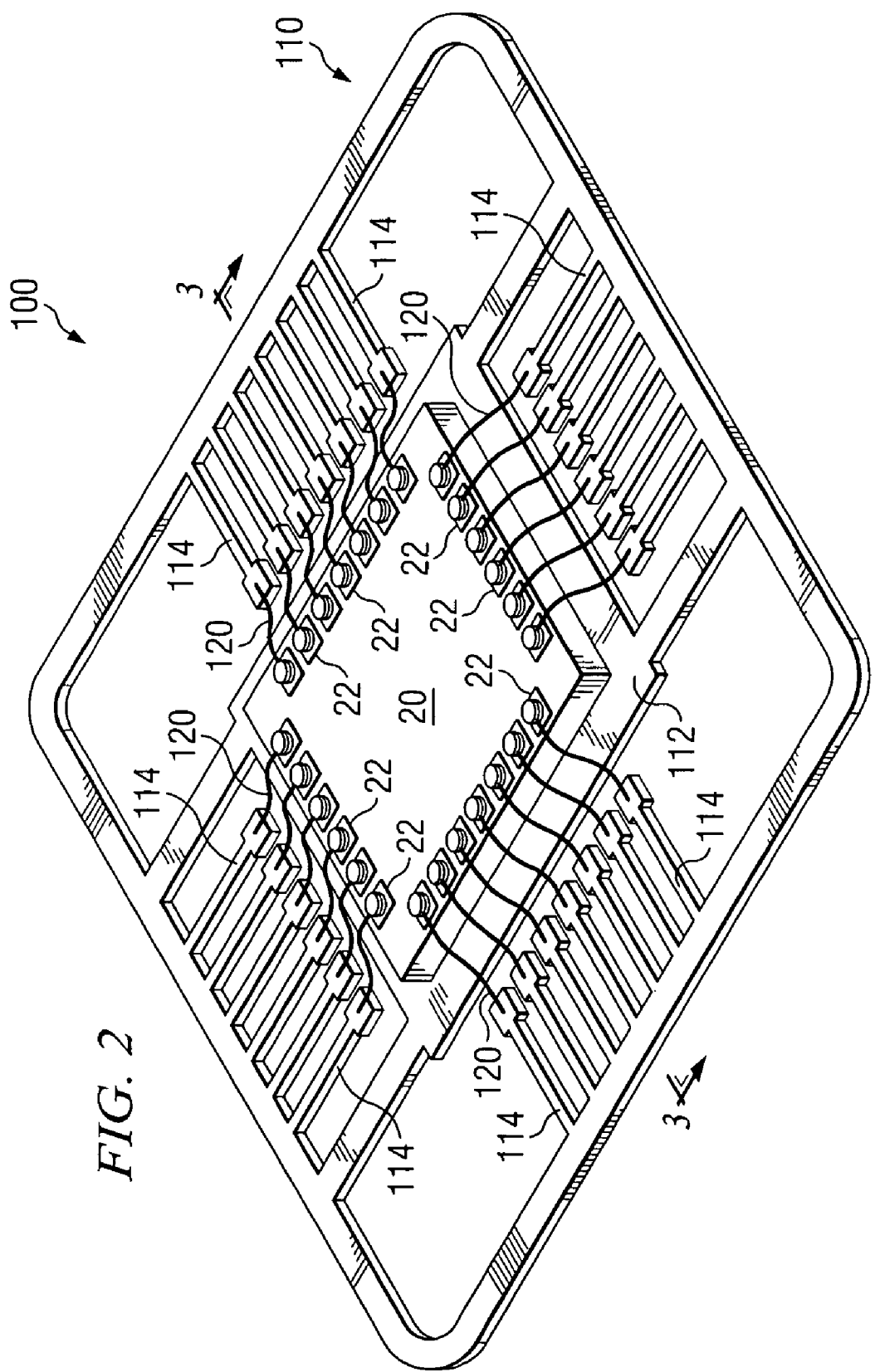
FIG. 2 illustrates an example leadframe assembly.

FIG. 2 illustrates an example leadframe assembly 100. Leadframe assembly 100 includes a leadframe 110, a die 20 attached to leadframe 110, and wires 120 electrically coupling die 20 to leadframe 110. A leadframe, such as leadframe 110, may be made from any appropriate conductive material, such as metal. In certain embodiments, leadframe 110 may include a die attachment area 112. During packaging, die 20 is attached to die attachment area 112 using a gold-silicon eutectic layer, an epoxy adhesive material, or any other appropriate method of attaching die 20 to die attachment area 112. Once die 20 is attached to die attachment area 112, an automatic wire bonding tool may be used to attach wires 120 to bond pads 22 and leads 114, such that die 20 is electrically coupled to leads 114, as is described in more detail with respect to FIGS. 3A-3I. In certain embodiments, wires 120 may be made from any suitable conductive material, such as aluminum or gold, and have a diameter less than the diameter of a human hair. For example, wires 120 may have a diameter of approximately 25 micrometers ($\mu$m). After the appropriate electrical connections have been made between die 20 and leadframe 110, a portion of leadframe assembly 110 may be encapsulated in a block of plastic or epoxy. The encapsulation process is well known and is not described in further detail.

As advances in technology demand decreasing semiconductor package sizes, the volume of space used by wires 120 becomes an important factor. According to the teachings of the present invention, a system and method for low loop wire bonding are provided that allow for decreased semiconductor package size, while maintaining or improving semiconductor reliability.

Figure 3A:
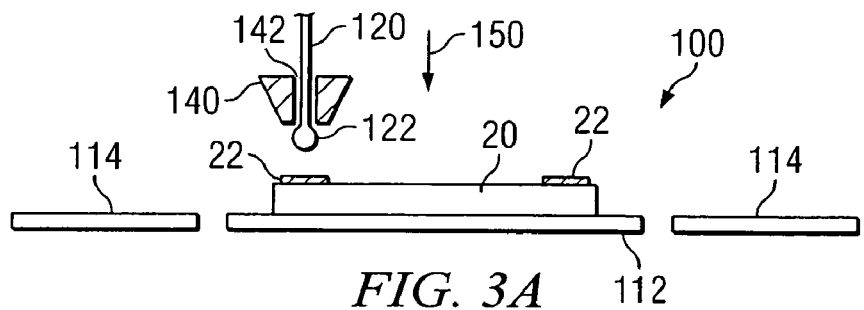
FIGS. 3A-3I illustrate cross-sectional views of an example system for low loop wire bonding.
Figure 3B:
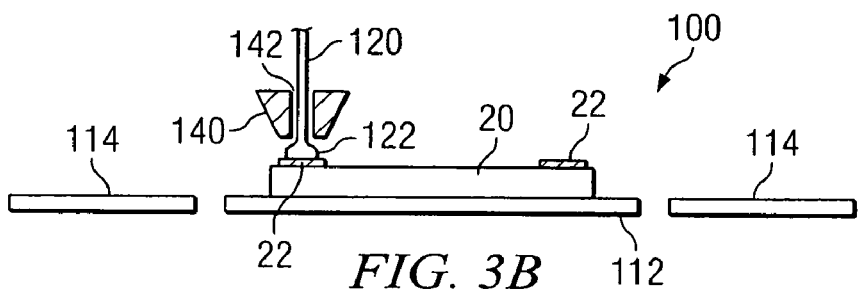
Figure 3C:
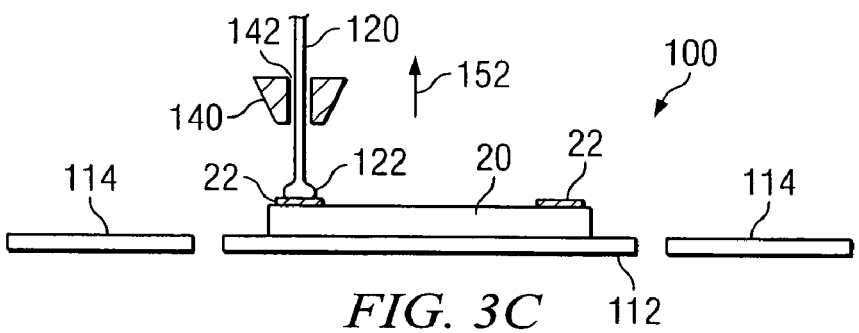

FIGS. 3A-3I illustrate example cross-sectional views of an example system for low loop wire bonding. FIGS. 3A-3C illustrate a wire 120 being bonded to bond pads 22 of die 20. In FIG. 3A, wire 120 includes a bonding ball 122 disposed at the end of wire 120. In certain embodiments, bonding ball 122 may be formed by using an instantaneous electrical spark or a small hydrogen flame to melt the tip of wire 120 to form bonding ball 122. The conventional formation and use of bonding balls, such as bonding ball 122, is well known to those of skill in the art. Wire 120 is disposed in, and gripped by, a bonding head 140 of an automatic wire-bonding tool. Bonding head 140 may be any suitable size and shape and may be formed from any suitable material. In certain embodiments, bonding head 140 may be formed from a ceramic material. Bonding head 140 includes a wire passage 142, also known as a "capillary," that is configured to accept a suitable wire 120. Wire passage 142 may have any suitable profile and may be formed in bonding head 140 in any suitable manner. Although FIG. 3A illustrates a single bonding head 140, any appropriate number of boding heads 140 may be used, so that one or more wires 120 may be bonded to bond pads 22 of die 20 simultaneously.

In certain embodiments, bonding head 140 may be positioned over die 20 using a computer controlled apparatus, such as a robotic arm, to position bonding head 140, and thus wire 120 and bonding ball 122, over a bonding pad 22. In an alternate embodiment, die 20 may be positioned under bonding head 140 using the computer controlled apparatus. As illustrated in FIG. 3A, bonding head 140 moves toward bond pad 22, as indicated by directional arrow 150. In certain embodiments, heat is applied to bonding ball 122 to soften ball 122. In FIG. 3B, bonding head 140 has descended towards bond pad 22, thereby pressing the heated bonding ball 122 against bond pad 22, causing the bonding ball 122 to at least partially flatten against bond pad 22, forming a bond between wire 120 and pad 22. This type of bonding is referred to as "thermocompression" bonding. In an alternate embodiment, a pulse of ultrasonic energy may be applied to ball 122. This additional energy is sufficient to provide the heat necessary to soften bonding ball 122 so that it may be pressed against and bond with pad 22. This type of bonding is referred to as "thermosonic" bonding. Although thermocompression and thermosonic bonding methods are discussed above, any other appropriate method for bonding pad 22 and bonding ball 122 may be implemented.

In FIG. 3C, bonding head 140 releases its grip on wire 120 and ascends away from die 20, as indicated by directional arrow 152. When bonding head 140 ascends a preliminary "loop height," illustrated as loop height 190 in FIG. 3D, bonding head 140 is positioned over lead 114 (or lead 114 may be positioned under bonding head 114). In general, the conventional wire bonding process requires a certain minimum loop height in order to reduce mechanical strain on the wire bond and to prevent damage to the wires caused by the mechanical strain, such as "neck" damage. Such wire damage can decrease the integrity of the bond, as well as affect the electrical performance of the bond. For example, when using conventional loop bonding, experiments conducted in association with the present invention have shown that a typical average loop height 190 for conventional loop bonding may be approximately 65 $\mu$m. A typical range of loop heights 190 for conventional loop bonding may be approximately 59 $\mu$m to 72 $\mu$m. As will be illustrated in FIGS. 3G through 3I, embodiments of the present invention allow a lower loop height than conventional techniques, while reducing the effects of damage to the wires.

Figure 3D:
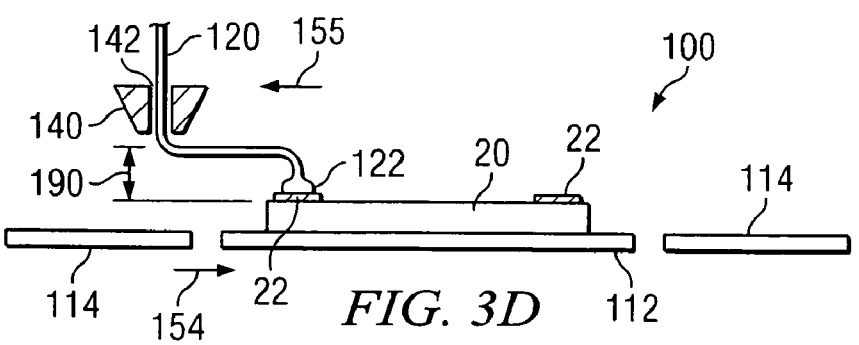

FIG. 3D illustrates bonding head 140 moving laterally to be positioned over lead 114, as indicated by directional arrow 155. In an alternate embodiment, leadframe assembly 100 may be moved laterally such that lead 114 is positioned under bonding head 140, as indicated by directional arrow 154. In certain embodiments, one result of the conventional wire loop bonding process is that the mechanical tension applied to wire 120 at the bonding joint with pad 22 during conventional loop bonding may cause damage to wire 120 near bonding ball 122. The damage caused by conventional loop bonding is often referred to as "neck damage" because it occurs near the joint, or "neck," between wire 120 and bonding ball 122. Such damage may limit the pull strength of the bond between wire 120 and pad 22, which may negatively effect the performance of the bond. For example, experiments conducted in association with the present invention have shown that conventional loop bonding may result in a wire pull strength in the range of approximately 1.6 grams-force to approximately 6.3 grams-force. Therefore, when using conventional loop bonding techniques, experiments have indicated that wires 120 may pull away from die 20 with as little as 1.6 grams-force of tension applied to wire 120. A method for counteracting neck damage and increasing the pull strength of wire 120 is discussed below with respect to FIGS. 3G-3I.

Figure 3E:
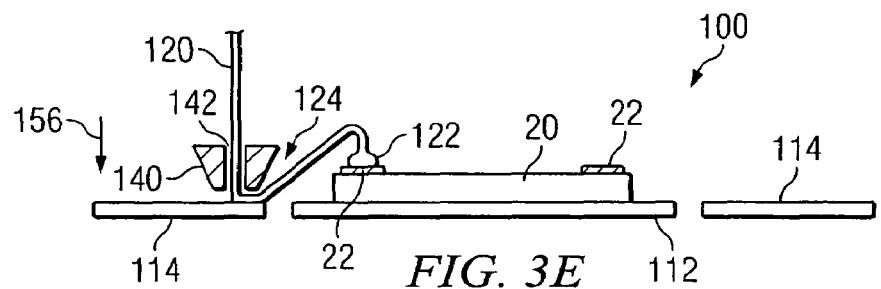

FIG. 3E illustrates bonding head 140 descending toward lead 114, as indicated by directional arrow 156. Although the descent of bonding head 140 towards lead 114 is illustrated in FIG. 3E as a distinct movement from the lateral positioning of bonding head 140 with respect to lead 114 illustrated in FIG. 3D, in certain embodiments, these positioning movements may occur simultaneously. Using any appropriate bonding technique, such as thermocompression or thermosonic bonding, wire 120 is bonded to lead 114. As wire 120 comes into contact with the surface of lead 114, bonding head 140 deforms wire 120 against lead 114, which creates a wedge-shaped bond 124 that may have a gradual transition into wire 120.

Figure 3F:
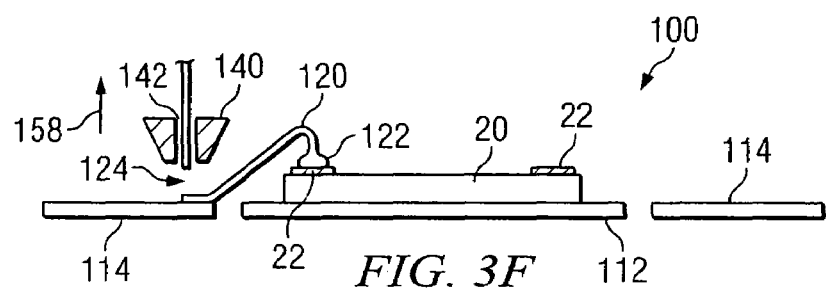

FIG. 3F illustrates the separation of wire 120 from bond 124. An electrical spark or small hydrogen flame may be used to sever wire 120 from bond 124. This same electrical spark or flame may be used to simultaneously form a new bonding ball 122 at the tip of wire 120 disposed within wire passage 142 to prepare wire 120 for bonding to another pad 22.

Figure 3G:
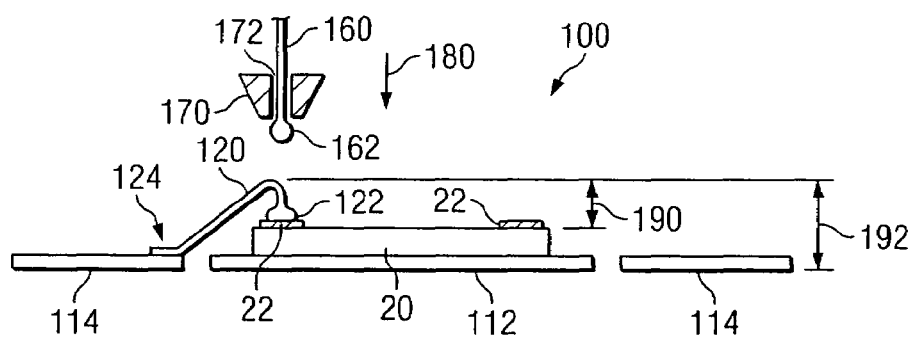
Figure 3H:
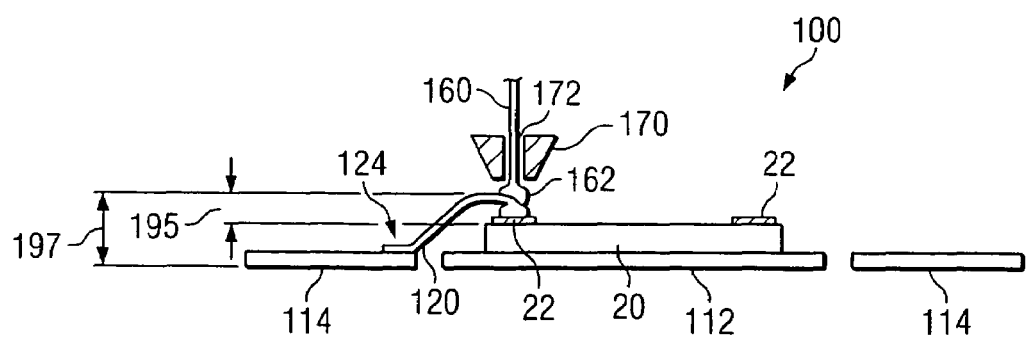
Figure 3I:
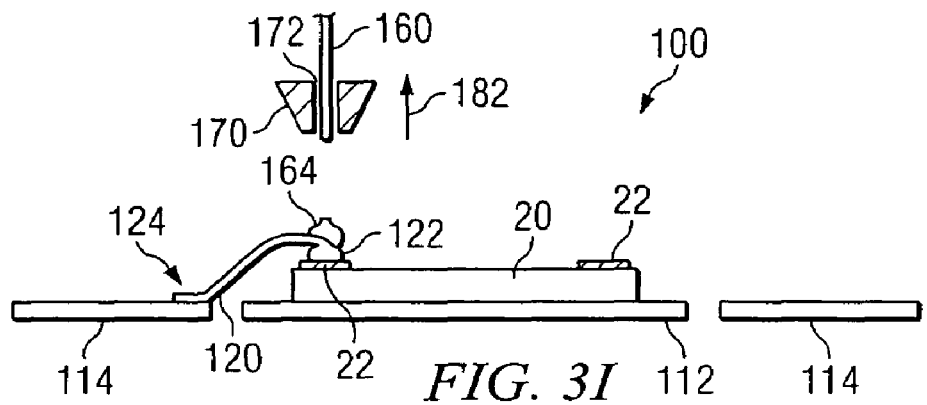

FIGS. 3G-3I illustrate the process of bonding a stud bump to bonding ball 120. In FIG. 3G, the overall height, or thickness, of leadframe assembly 100 after conventional loop bonding is illustrated as package height 192. A wire 160 is disposed in, and gripped by, a bonding head 170 of an automatic wire-bonding tool. In certain embodiments, bonding head 170 may be formed from a ceramic material. Bonding head 170 may be any suitable size and shape and may be formed from any suitable material. Bonding head 170 may be substantially similar in structure and function to bonding head 140 of FIGS. 3A-3F. Furthermore, in certain embodiments, the same automatic wire-bonding tool may be used as both bonding heads 140, 170. In an alternate embodiment, a separate automatic wire-bonding tool may be used for each of bonding heads 140, 170. Although FIG. 3G illustrates a single bonding head 170, any appropriate number of bonding heads may be used, so that one or more bonding balls 162 may be positioned over die 20 simultaneously.

Bonding head 170 includes a wire passage 172, also known as a "capillary," that is configured to accept a suitable wire 160. Wire 160 includes a bonding ball 162 disposed at the end of wire 160. Wire 160 and bonding ball 162 may be substantially similar in structure to wire 120 and bonding ball 122. In certain embodiments, wire 160 may be the same wire (wire 120) used in the initial bonding process illustrated in FIGS. 3A-3F. The method for forming bonding ball 162 may be the same as, or substantially similar to, the method for forming bonding ball 122.

In certain embodiments, bonding head 170 may be positioned over die 20 using a computer controlled apparatus, such as a robotic arm, to position bonding head 170, and thus wire 160 and bonding ball 162, over bonding pad 22 to which wire 120 has been attached. In certain embodiments, bonding head 170 may be the same or substantially similar to bonding head 140 used to attach wire 120 to bonding pad 22.

As illustrated in FIG. 3G, bonding head 160 moves toward bond pad 22, as indicated by directional arrow 180. In certain embodiments, heat or ultrasonic energy is applied to bonding ball 162 to soften ball 162. In FIG. 3H, bonding head 170 has descended towards bond pad 22, thereby pressing bond ball 162 against wire 120 and bonding ball 122, which causes wire 120 to deform, reducing loop height 190 to a lower loop height 195. Bonding ball 162 is at least partially flattened against wire 120 and bonding ball 122. Similar to the discussion above, either thermocompression or thermosonic bonding may be used, although any other appropriate method for bonding ball 162 to wire 120 and ball 122 may also be implemented.

In FIG. 3H, bonding head 170 releases its grip on wire 160 and ascends away from die 20, as indicated by directional arrow 182. Using a suitable flash process, or any other suitable technique, ball 162 is separated from the rest of wire 160, forming a "stud bump" 164.

Experiments conducted in association with the present invention have shown that a typical average loop height for the method of loop bonding of embodiments of the present invention may be approximately 47 μm as compared to approximately 65 μm using conventional loop bonding as illustrated in FIGS. 3A-3F. A typical range of loop heights 195 for the loop bonding technique of the present invention has been shown experimentally to be approximately 40 μm to approximately 52 μm. This results in a lower overall leadframe assembly height 197 than height 192 achieved using conventional loop bonding. The process illustrated in FIGS. 3G-3I reduces the loop height of the wire bonds, thereby decreasing the overall height of leadframe assembly 100 prior to encapsulation, which, in turn, reduces the height, or thickness, of the semiconductor package. The reduction in loop height occurs because after stud bump 163 is bonded to bonding ball 122, the angle at which wire 120 extends from the bond is reduced, thereby reducing the height of the loop. As illustrated in FIG. 3G, wire 120 extends substantially vertically from bonding ball 122 prior to the addition of stud bump 164 to the bond. However, as illustrated in FIGS. 3H-3I, after stud bump 164 is bonded to bonding ball 122, wire 120 extends non-vertically from the bond, thereby reducing the loop height.

In certain embodiments, the method for low loop bonding of the present invention not only reduces the overall thickness of the semiconductor package, but the process of bonding a stud bump 164 to wire 120 and bonding ball 122 also may improve the pull strength of wire 120. This occurs because the bond created by the addition of stud bump 164 is stronger than a conventional bond due, in part, to the fact that the portion of wire 120 that may contain neck damage has be incorporated into the bond with bonding ball 122 and stud bump 164, thereby increasing the strength of the bond. Experiments have indicated that the pull strength of wire 120 after stud bump 164 has been bonded to wire 120 and ball 122 increases when compared to the pull strength of wire 120 after the conventional loop bonding process illustrated in FIGS. 3A-3F. For example, in certain embodiments, experiments indicated that after the bonding of stud bump 164, the pull strength range of wire 120 is approximately 4.3 grams-force to approximately 6.5 grams-force with an average pull strength of approximately 5.9 grams-force. Therefore, using the loop bonding method described with respect to FIGS. 3G-3I, the minimum pull strength of wire 120 was shown by experiment to increase, in certain embodiments, from approximately 1.6 grams-force to approximately 4.3 grams-force.

Figure 4:
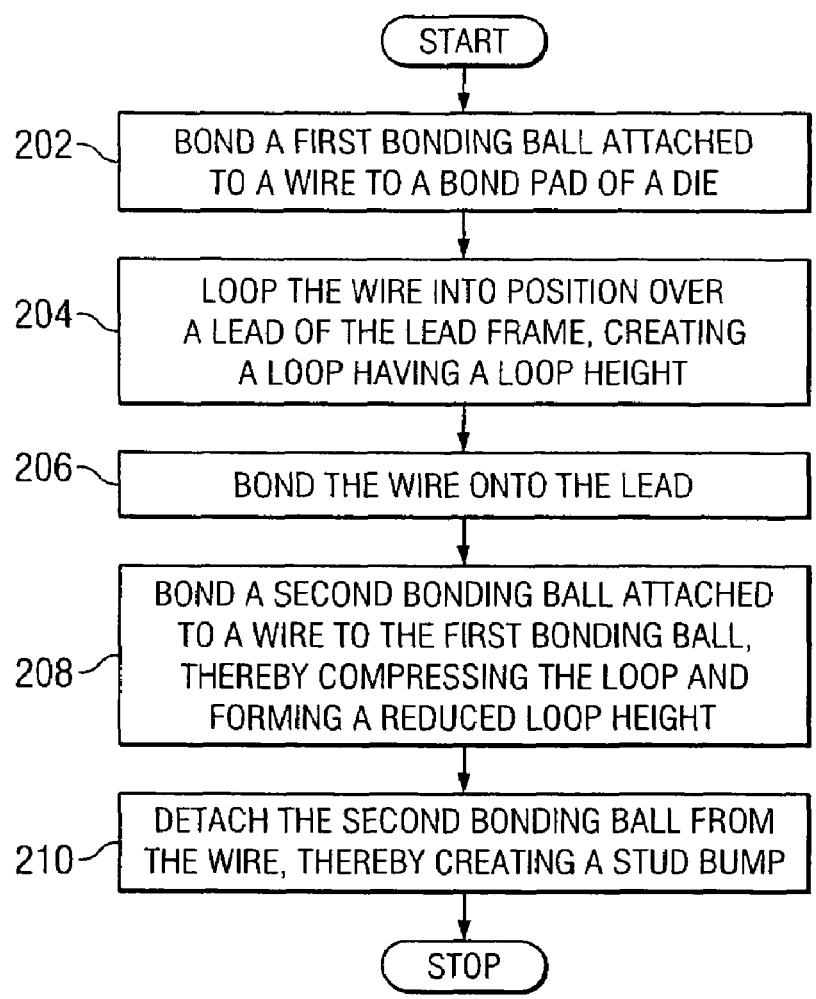
FIG. 4 illustrates an example method for low loop wire bonding.

FIG. 4 illustrates an example method 200 for low loop wire bonding. The method begins at step 202 where a bonding ball, such as bonding ball 122, attached to a wire, such as wire 120, is bonded to a pad 22 of a die 20. As discussed above with respect to FIGS. 3A-3C, any appropriate method of bonding, such as thermocompression or thermosonic bonding may be used to bond ball 122 to pad 22. At step 204, wire 120 is positioned over lead 114 creating a loop having loop height 190, as illustrated in FIG. 3D. At step 206, wire 120 is bonded to lead 114 forming a bond 124. Wire 120 is then severed from bond 124 using an electrical spark or small hydrogen flame that creates another bond ball on the end of wire 120. At step 208, bond ball 162 is positioned over pad 22 and bonded to wire 120 and bond ball 122 that were previously bonded to pad 22. As illustrated in FIG. 3H, this step compresses the original loop of wire 120, thereby reducing the loop height from loop height 190 to loop height 195. Finally, at step 210, bond ball 162 is severed from wire 160, leaving stud bump 164 bonded to wire 120 and bond ball 122. As discussed above, in certain embodiments, the "stacking" of stud bump 164 on top of wire 120 and bond ball 122 where they are bonded to pad 22 not only reduces the thickness of the semiconductor package (by reducing the loop height), it also serves to improve the pull strength of wire 120 and, therefore, improves the reliability of the semiconductor device.

Although example methods are illustrated, the present invention contemplates two or more steps taking place substantially simultaneously or in a different order. In addition, the present invention contemplates using methods with additional steps, fewer steps, or different steps, so long as the steps remain appropriate for low loop wire bonding.

Although the present invention has been described with several embodiments, numerous changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A method for low loop wire bonding, comprising:
   forming a first bond between a first bonding ball disposed at an end of a first wire and a bond pad of a die, the die coupled to a leadframe having one or more leads;
   forming a second bond between a portion of the wire and a lead of the leadframe, the length of wire between the first and second bonds forming a loop in the wire having a first loop height;
   disposing a second bonding ball on top of the first bonding ball, a portion of the loop being compressed between the first and second bonding balls, the compressed loop having a second loop height less than the first loop height by between about 25 μm and about 13 μm; and
   forming a third bond between the second bonding ball, the wire, and the first bonding ball.

2. The method of claim 1, further comprising disposing the wire within a bonding head, the first bonding ball extending from an end of the bonding head.

3. The method of claim 2, further comprising positioning the bonding head relative to the leadframe to:
   position the first bonding ball relative to the bond pad to which the first bond will be formed; and
   position the portion of the wire relative to the lead of the leadframe to which the second bond will be formed.

4. The method of claim 2, further comprising positioning the leadframe relative to the bonding head to:
   position the bond pad to which the first bond will be formed relative to the first bonding ball; and
   position the lead of the leadframe to which the second bond will be formed relative to the portion of the wire.

5. The method of claim 1, wherein the wire and the first and second bonding balls are formed from gold.

6. The method of claim 5, wherein the gold wire has a diameter of approximately 25 μm.

7. The method of claim 1, wherein the first, second, and third bonds are formed using a bonding method selected from the group consisting of thermocompression bonding and thermosonic bonding.

8. The method of claim 1, wherein the second loop height is between approximately 40 μm to approximately 52 μm.

9. The method of claim 1, further comprising:
   severing the wire proximate to the second bond;
   forming the second bonding ball at the tip of the severed wire;
   severing the second bonding ball from the wire after forming the third bond.

10. The method of claim 1, further comprising:
    severing the wire proximate to the second bond;
    forming the second bonding ball at the tip of a second wire; and
    severing the second bonding ball from the second wire after forming the third bond.

11. A method for low loop wire bonding, comprising:
    disposing a gold wire within a bonding head, the gold wire comprising a first bonding ball disposed at one end of the wire, the first bonding ball extending from an end of the bonding head;
    positioning the bonding head relative to a leadframe to position the first bonding ball relative to a bond pad to which a first bond will be formed;
    forming the first bond between the first bonding ball and the bond pad;
    positioning the bonding head relative to the leadframe to position a portion of the wire relative to a lead of the leadframe to which a second bond will be formed;
    forming the second bond between the portion of the wire and the lead, the length of wire between the first and second bonds forming a loop in the wire having a first loop height;
    severing the wire proximate to the second bond;
    forming a second bonding ball at a tip of the severed wire;
    disposing the second bonding ball on top of the first bonding ball, a portion of the loop being compressed between the first and second bonding balls, the compressed loop having a second loop height less than the first loop height by between about 25 μm and about 13 μm, wherein the second loop height is approximately less than 52 μm; and
    forming a third bond between the second bonding ball, the wire, and the first bonding ball; wherein the first, second, and third bonds are formed using a bonding method selected from the group consisting of thermocompression bonding and thermosonic bonding.

* * * * *